US011695061B2

(12) United States Patent
Huang et al.

(10) Patent No.: US 11,695,061 B2
(45) Date of Patent: Jul. 4, 2023

(54) FINFETS WITH LOW SOURCE/DRAIN CONTACT RESISTANCE

(71) Applicant: Taiwan Semiconductor Manufacturing Co., Ltd., Hsinchu (TW)

(72) Inventors: Yu-Lien Huang, Jhubei (TW); Tung Ying Lee, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 169 days.

(21) Appl. No.: 17/173,090

(22) Filed: Feb. 10, 2021

(65) Prior Publication Data

US 2021/0167192 A1 Jun. 3, 2021

Related U.S. Application Data

(60) Continuation of application No. 16/910,662, filed on Jun. 24, 2020, now Pat. No. 11,271,095, which is a
(Continued)

(51) Int. Cl.
*H01L 29/66* (2006.01)
*H01L 29/78* (2006.01)
(Continued)

(52) U.S. Cl.
CPC .. *H01L 29/66795* (2013.01); *H01L 21/28518* (2013.01); *H01L 21/30604* (2013.01);
(Continued)

(58) Field of Classification Search
CPC ......... H01L 29/66795; H01L 21/28518; H01L 21/30604; H01L 21/31111; H01L 21/31116; H01L 21/76897; H01L 21/823431; H01L 21/823475; H01L 21/823481; H01L 27/0886; H01L 29/456;
(Continued)

(56) References Cited

U.S. PATENT DOCUMENTS 6,583,469 B1 * 6/2003 Fried ................ H01L 29/66818
257/329
8,609,495 B2 12/2013 Gan et al.
(Continued)

FOREIGN PATENT DOCUMENTS

CN 103219380 A 7/2013

*Primary Examiner* — Victor A Mandala
(74) *Attorney, Agent, or Firm* — Slater Matsil, LLP

(57) ABSTRACT

An integrated circuit structure includes a semiconductor substrate, insulation regions extending into the semiconductor substrate, with the insulation regions including first top surfaces and second top surfaces lower than the first top surfaces, a semiconductor fin over the first top surfaces of the insulation regions, a gate stack on a top surface and sidewalls of the semiconductor fin, and a source/drain region on a side of the gate stack. The source/drain region includes a first portion having opposite sidewalls that are substantially parallel to each other, with the first portion being lower than the first top surfaces and higher than the second top surfaces of the insulation regions, and a second portion over the first portion, with the second portion being wider than the first portion.

20 Claims, 16 Drawing Sheets

Related U.S. Application Data continuation of application No. 16/230,132, filed on Dec. 21, 2018, now Pat. No. 10,714,597, which is a continuation of application No. 15/595,454, filed on May 15, 2017, now Pat. No. 10,164,064, which is a division of application No. 14/229,218, filed on Mar. 28, 2014, now Pat. No. 9,653,461.

(51) Int. Cl.

| | | |
|---|---|---|
| *H01L 27/088* | (2006.01) | |
| *H01L 29/45* | (2006.01) | |
| *H01L 21/311* | (2006.01) | |
| *H01L 21/768* | (2006.01) | |
| *H01L 21/285* | (2006.01) | |
| *H01L 21/306* | (2006.01) | |
| *H01L 21/8234* | (2006.01) | |

(52) U.S. Cl.
CPC ... *H01L 21/31111* (2013.01); *H01L 21/31116* (2013.01); *H01L 21/76897* (2013.01); *H01L 21/823431* (2013.01); *H01L 21/823475* (2013.01); *H01L 21/823481* (2013.01); *H01L 27/0886* (2013.01); *H01L 29/456* (2013.01); *H01L 29/66545* (2013.01); *H01L 29/66636* (2013.01); *H01L 29/785* (2013.01); *H01L 21/76843* (2013.01); *H01L 21/76855* (2013.01)

(58) Field of Classification Search
CPC ......... H01L 29/66545; H01L 29/66636; H01L 29/785; H01L 21/76843; H01L 21/76855
See application file for complete search history.

(56) References Cited

U.S. PATENT DOCUMENTS

| | | | |
|---|---|---|---|
| 8,633,516 | B1 | 1/2014 | Wu et al. |
| 8,878,300 | B1* | 11/2014 | Liu ................. H01L 29/785 438/300 |
| 9,202,918 | B2* | 12/2015 | Xie ................. H01L 29/785 |
| 9,466,696 | B2 | 10/2016 | Mor et al. |
| 9,653,461 | B2* | 5/2017 | Huang ........... H01L 21/823481 |
| 10,164,107 | B2* | 12/2018 | Chang ............ H01L 29/66795 |
| 10,797,162 | B2* | 10/2020 | Lin ................. H01L 29/161 |
| 2007/0278576 | A1 | 12/2007 | Kim et al. |
| 2011/0068407 | A1 | 3/2011 | Yeh et al. |
| 2011/0095378 | A1 | 4/2011 | Lee et al. |
| 2011/0121406 | A1* | 5/2011 | Lee ................. H01L 29/0649 257/E27.06 |
| 2011/0133292 | A1* | 6/2011 | Lee ................. H01L 21/823431 257/401 |
| 2012/0319211 | A1 | 12/2012 | van Dal et al. |
| 2013/0187228 | A1* | 7/2013 | Xie ................. H01L 29/66795 257/E21.409 |
| 2013/0221447 | A1* | 8/2013 | Lee ................. H01L 29/6681 257/369 |
| 2014/0001520 | A1 | 1/2014 | Glass et al. |
| 2014/0159159 | A1* | 6/2014 | Steigerwald ...... H01L 29/66795 257/369 |
| 2014/0285980 | A1 | 9/2014 | Cappellani et al. |
| 2015/0041918 | A1* | 2/2015 | Wann ............... H01L 27/0886 438/283 |
| 2015/0060960 | A1* | 3/2015 | Xie ................. H01L 21/76897 257/288 |
| 2015/0214228 | A1* | 7/2015 | Koh ................ H01L 21/823821 257/369 |
| 2015/0279840 | A1* | 10/2015 | Huang ............ H01L 29/66545 438/283 |
| 2016/0043223 | A1* | 2/2016 | Xie ................. H01L 29/7848 257/401 |
| 2017/0170061 | A1* | 6/2017 | Wang .............. H01L 21/76888 |
| 2020/0127091 | A1* | 4/2020 | Glass ............. H01L 29/78 |

* cited by examiner

FINFETS WITH LOW SOURCE/DRAIN CONTACT RESISTANCE

CROSS-REFERENCE TO RELATED APPLICATIONS

This application is a continuation of U.S. patent application Ser. No. 16/910,662, filed on Jun. 24, 2020, and entitled "FinFETs with Low Source/Drain Contact Resistance," which is a continuation of U.S. patent application Ser. No. 16/230,132, filed on Dec. 21, 2018, now U.S. Pat. No. 10,714,597 issued Jul. 14, 2020 and entitled "FinFETs with Low Source/Drain Contact Resistance," which is a continuation of U.S. patent application Ser. No. 15/595,454, filed on May 15, 2017, now U.S. Pat. No. 10,164,064 issued Dec. 25, 2018 and entitled "FinFETs with Low Source/Drain Contact Resistance," which application is a divisional of U.S. patent application Ser. No. 14/229,218, filed on Mar. 28, 2014, now U.S. Pat. No. 9,653,461 issued May 16, 2017, and entitled "FinFETs with Low Source/drain Contact Resistance," which applications are hereby incorporated herein by reference.

BACKGROUND

Transistors typically include semiconductor regions that are used to form the source regions and drain regions. The contact resistance between metal contact plugs and the semiconductor regions is high. Accordingly, metal silicides are formed on the surfaces of the semiconductor regions such as silicon regions, germanium regions, and silicon germanium regions in order to reduce the contact resistance. The contact plugs are formed to contact the silicide regions, and the contact resistance between the contact plugs and the silicide regions is low.

A typical silicidation process includes forming a metal layer on the surfaces of the semiconductor regions, and then performing an annealing, so that the metal layer reacts with the semiconductor regions to form the silicide regions. After the reaction, the upper portions of the metal layer may be left un-reacted. An etching step is then performed to remove the un-reacted portions of the metal layer. Contact plugs are then formed to contact the silicide regions.

With the increasing down-sizing of integrated circuits, the silicide regions, and hence the contact between the contact plugs and the silicide regions, also become increasingly smaller. Accordingly, the contact resistance of the electrical contacts becomes increasingly higher. For example, in Fin Field-Effect Transistors (FinFETs), the fins are very narrow, causing the contact areas between the contact plugs and the fins to be very small. The contact resistance to the source and drain regions of the FinFETs thus becomes an increasingly severe problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
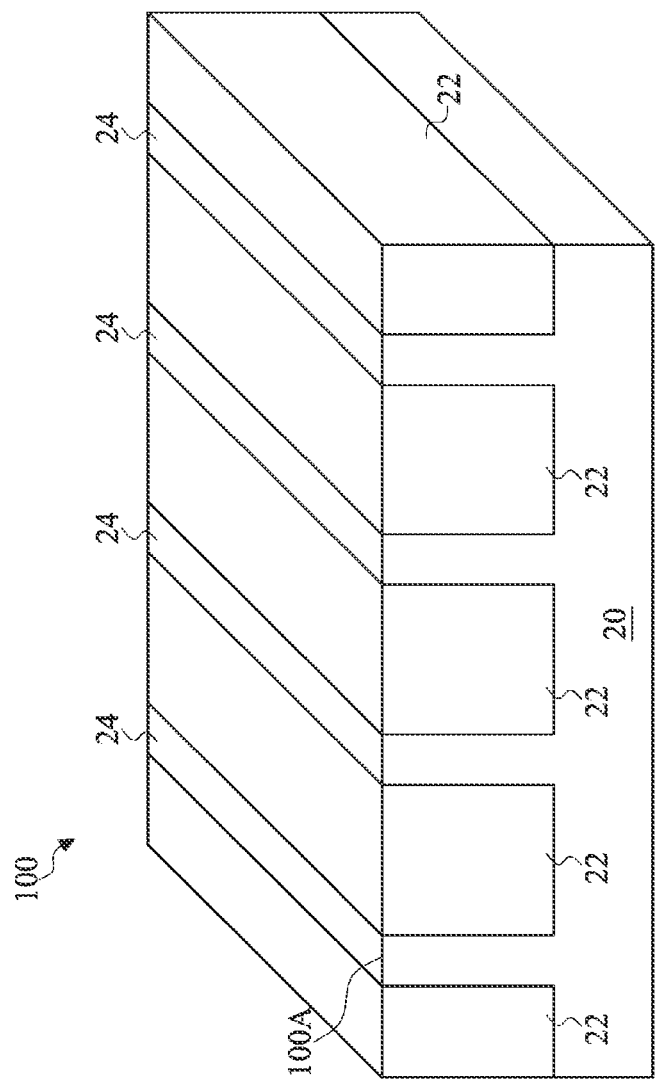
FIGS. 1 through 11C are cross-sectional views and perspective views of intermediate stages in the manufacturing of a Fin Field-Effect Transistor (FinFET) in accordance with some exemplary embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin Field-Effect Transistor (FinFET) and the method of forming the same are provided in accordance with various exemplary embodiments. The intermediate stages of forming the FinFET are illustrated. The intermediate stages of forming contacts to the FinFET are also illustrated. The variations of the embodiments are discussed. Throughout the various views and illustrative embodiments, like reference numbers are used to designate like elements.

FIGS. 1 through 11C are cross-sectional views and perspective views of intermediate stages in the manufacturing of a FinFET and the respective contacts in accordance with some exemplary embodiments. FIG. 1 illustrates a perspective view of an initial structure. The initial structure includes wafer 100, which further includes substrate 20. Substrate 20 may be a semiconductor substrate, which may further be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 24. The top surfaces of semiconductor strips 24 and the top surfaces of STI regions 22 may be substantially level with each other.

STI regions 22 may include silicon oxide, which may be formed using, for example, High-Density Plasma (HDP) Chemical Vapor Deposition (CVD). STI regions 22 may also include an oxide formed of Flowable Chemical Vapor Deposition (FCVD), spin-on, or the like.

Figure 2:
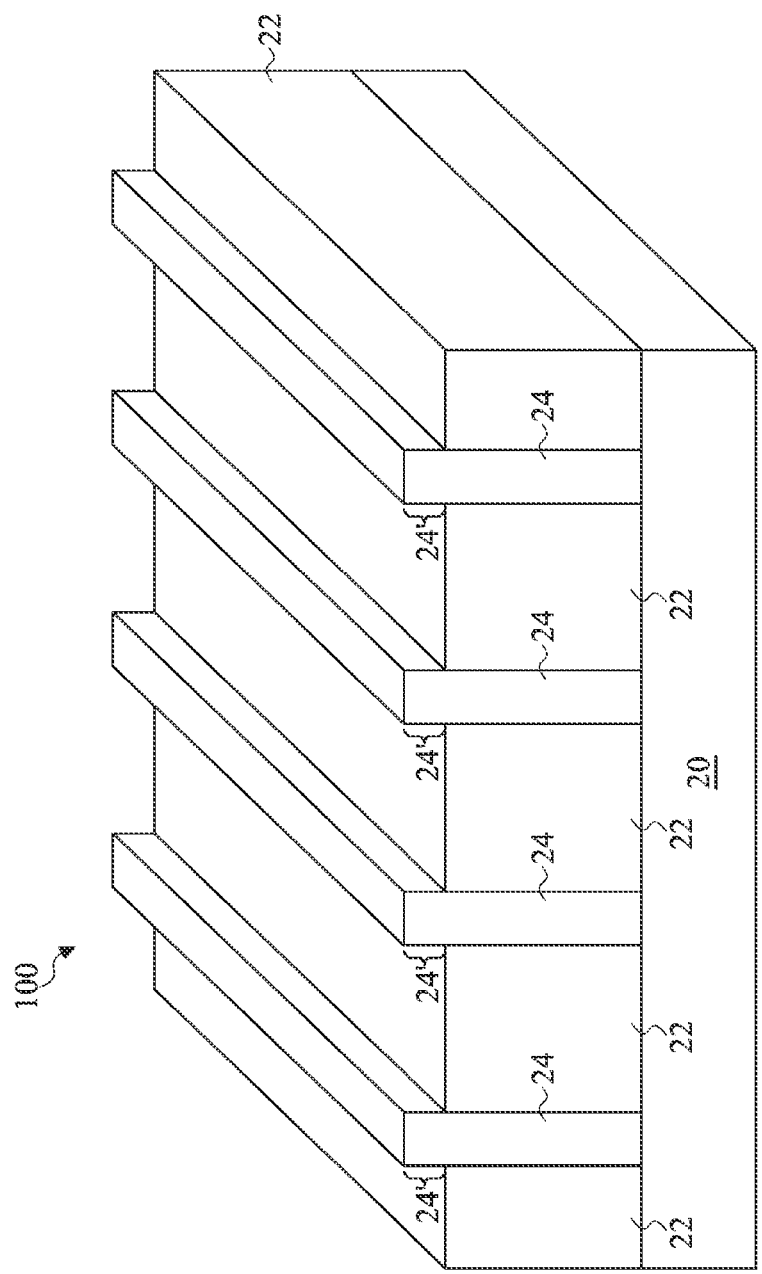

Referring to FIG. 2, STI regions 22 are recessed, so that top portions of semiconductor strips 24 are higher than the top surfaces of STI regions 22 to form semiconductor fins 24'. The etching may be performed in a dry etching process, wherein HF and NH$_3$ are used as the etching gases. In alternative embodiments, the etching gases include NF$_3$ and NH$_3$. During the etching process, plasma may be generated. Alternatively, in the etching process, plasma is turned on. In an exemplary etching process, the etching gases have a pressure in the range between about 100 mtorr and about 200 mtorr. The flow rate of HF may be in the range between about 50 sccm and about 150 sccm. The flow rate of NH$_3$ may be in the range between about 50 sccm and about 150 sccm. Argon may also be included, with a flow rate in the range between about 20 sccm and about 100 sccm. In alternative embodiments, the recessing of STI regions 22 is performed using wet etching. The etchant may include diluted HF, for example.

Figure 3:
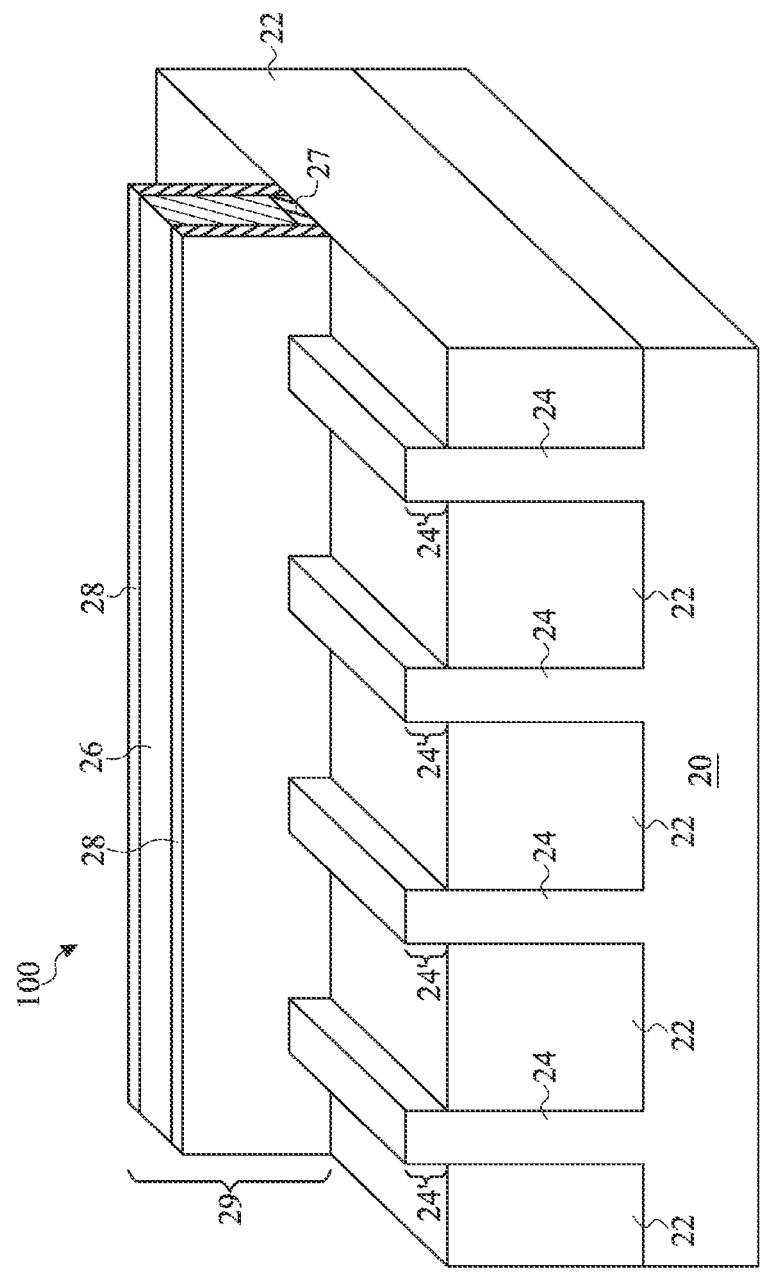

Referring to FIG. 3, gate stack 29 is formed on the top surface and sidewalls of semiconductor fins 24'. Gate stack 29 includes gate dielectric 27, and gate electrode 26 over gate dielectric 27. Gate electrode 26 may be formed, for example, using polysilicon, although other materials such as metal silicides, metal nitrides, or the like, may also be used. Gate stack 29 may also comprise a hard mask layer (not shown) over gate electrode 26, wherein the hard mask layer may comprise silicon oxide, for example. Gate stack 29 may cross over a single one or a plurality of semiconductor fins 24' and/or STI regions 22. Gate stack 29 may also have a lengthwise direction substantially perpendicular to the lengthwise direction of semiconductor fins 24'. In some embodiments, gate stack 29 forms the gate stack of the resulting FinFET. In alternative embodiments, gate stack 29 is a dummy gate stack, and will be replaced by a replacement gate in a subsequent step.

Next, gate spacers 28 are formed on the sidewalls of gate stack 29. In some embodiments, gate spacers 28 comprise silicon carbonitride (SiCN), silicon nitride, or the like, and may have a single-layer structure or a multi-layer structure.

Figure 4A:
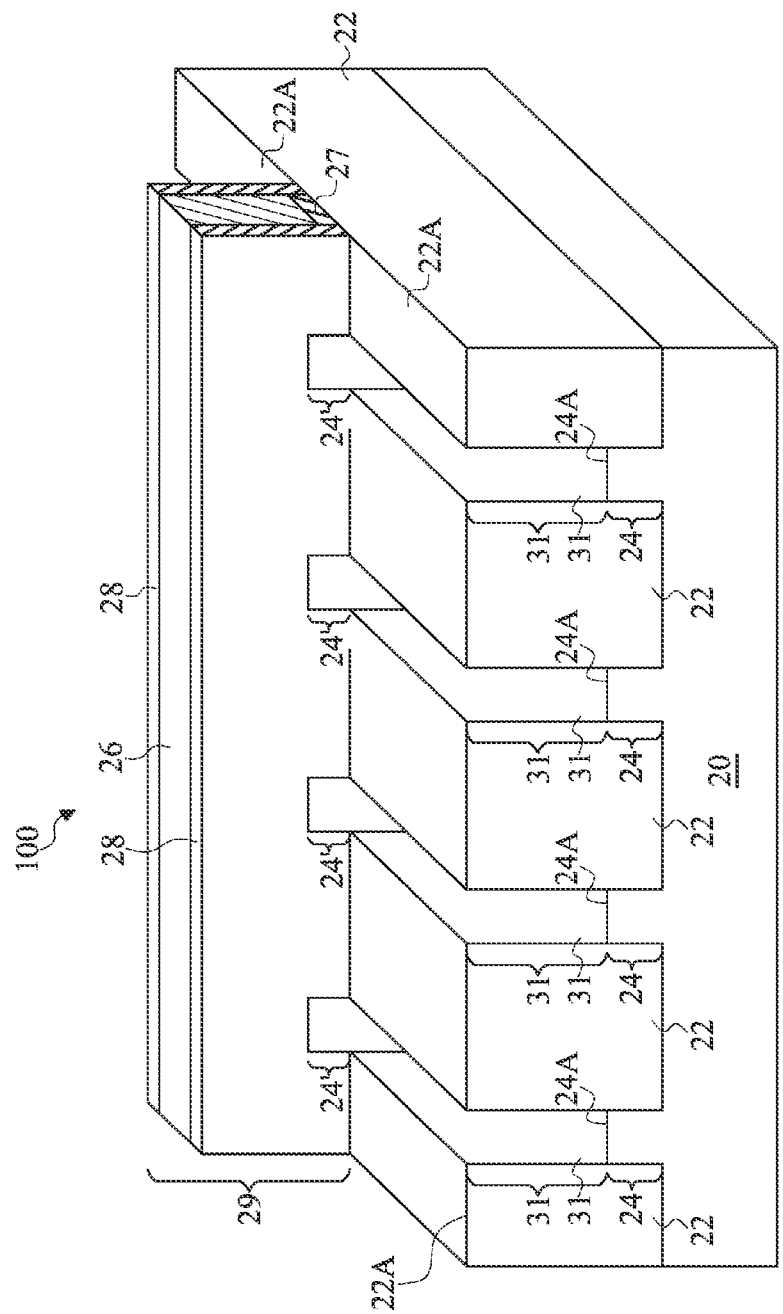

An etching step (referred to as source/drain recessing hereinafter) is then performed to etch portions of semiconductor fins 24' that are not covered by gate stack 29 and gate spacers 28, resulting in the structure shown in FIG. 4A. The recessing may be anisotropic, and hence the portions of semiconductor fins 24 directly underlying gate stack 29 and gate spacers 28 are protected, and are not etched. The top surfaces 24A of the recessed semiconductor strips 24 are lower than the top surfaces 22A of STI regions 22. Recesses 31 are accordingly formed between STI regions 22. Recesses 31 are located on opposite sides of gate stack 29.

Figure 4B:
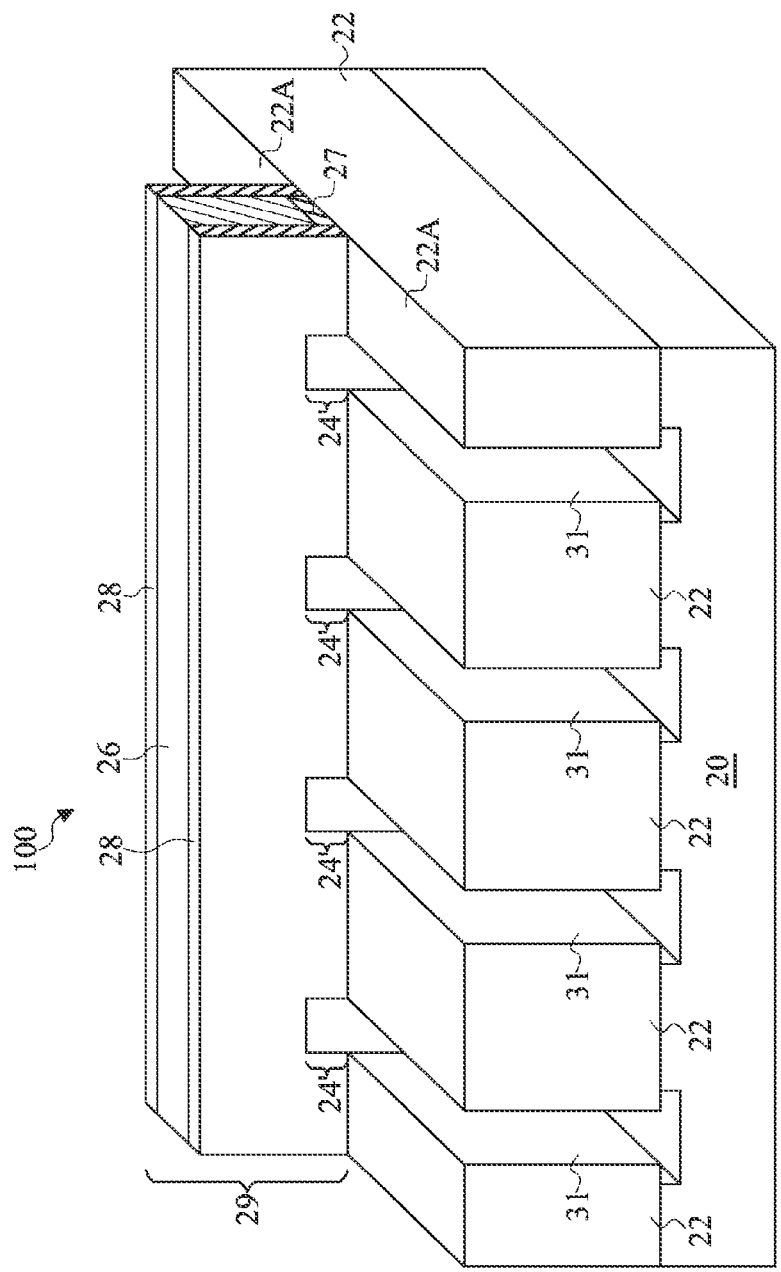

FIG. 4B illustrates a structure in accordance with alternative embodiments of the present disclosure, in which the source/drain recessing is performed until recesses 31 extend to a level below the bottom surfaces of STI regions 22. When recesses 31 reach the bottom surfaces of STI regions 22, further recessing will cause recesses 31 to expand laterally since there is no sidewalls of STI regions 32 preventing the lateral expansion. Accordingly, recesses 31 have the profile as shown in FIG. 4B.

Figure 5:
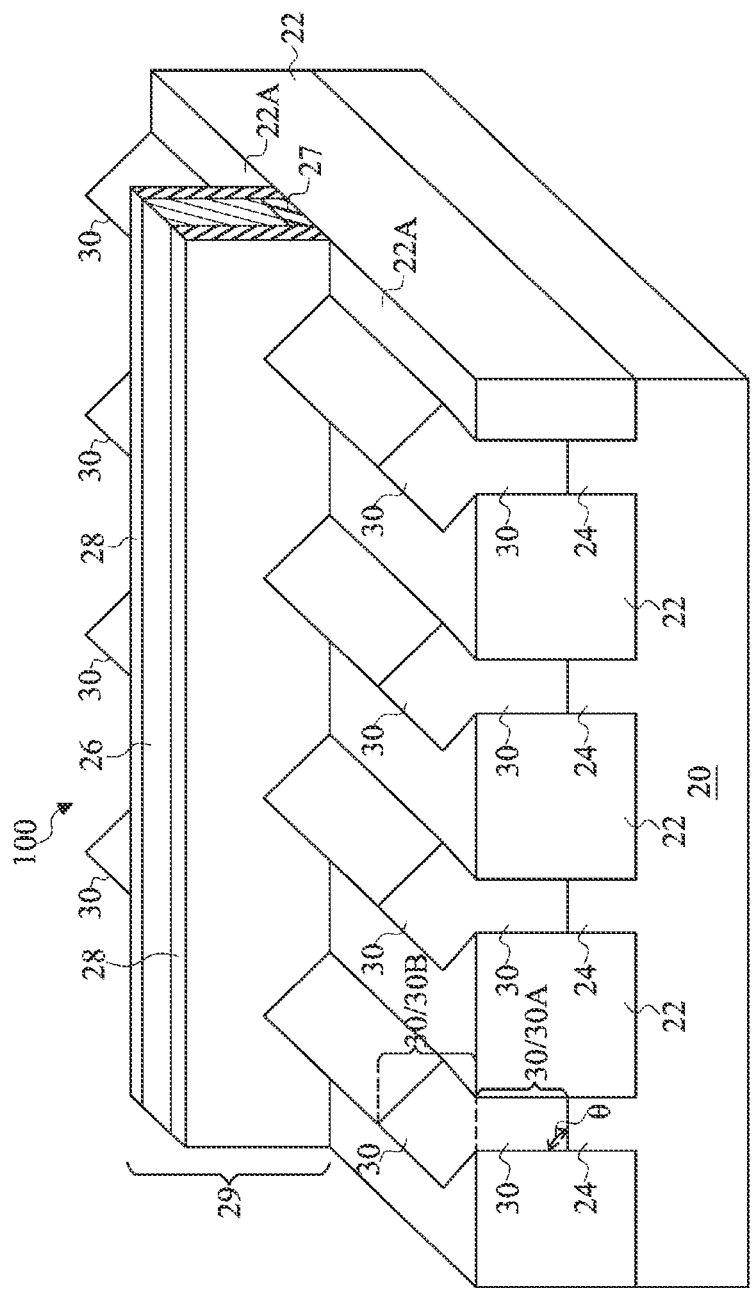

Next, as shown in FIG. 5, epitaxy regions 30 are formed by selectively growing a semiconductor material in recesses 31. In some exemplary embodiments, epitaxy regions 30 comprise silicon germanium or silicon. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, SiGeB may be grown. Conversely, when the resulting FinFET is an n-type FinFET, SiP may be grown. In alternative embodiments, epitaxy regions 30 comprise III-V compound semiconductors such as GaAs, InP, GaN, InGaAs, InAlAs, GaSb, AlSb, AlAs, AlP, GaP, combinations thereof, or multi-layers thereof. After recesses 31 are filled with epitaxy regions 30, the further epitaxial growth of epitaxy regions 30 causes epitaxy regions 30 to expand horizontally, and facets may start to form. Furthermore, some of top surfaces 22A of STI regions 22 are underlying and aligned to portions of epitaxy regions 30 due to the lateral growth of epitaxy regions 30.

After the epitaxy step, epitaxy regions 30 may be further implanted with a p-type or an n-type impurity to form source and drain regions, which are also denoted using reference numeral 30. In alternative embodiments, the implantation step is skipped since source and drain regions are formed during the epitaxy due to the in-situ doping of the p-type or n-type impurity. Source and drain regions 30 are on opposite sides of gate stack 29, and may be overlying and overlapping portions of surfaces 22A of STI regions 22. Epitaxy regions 30 include lower portions 30A that are formed in STI regions 22, and upper portions 30B that are formed over the top surfaces 22A of STI regions 22. Lower portions 30A, whose sidewalls are shaped by the shapes of recesses 31 (FIG. 4), may have (substantially) straight edges, which may also be vertical edges that are perpendicular to the major surfaces (a bottom surface 20B) of substrate 20 as being shown in FIG. 5. For example, the tilt angle θ of the sidewalls of lower portions 30A may be in the range between about 80 degrees and about 90 degrees.

Figure 6:
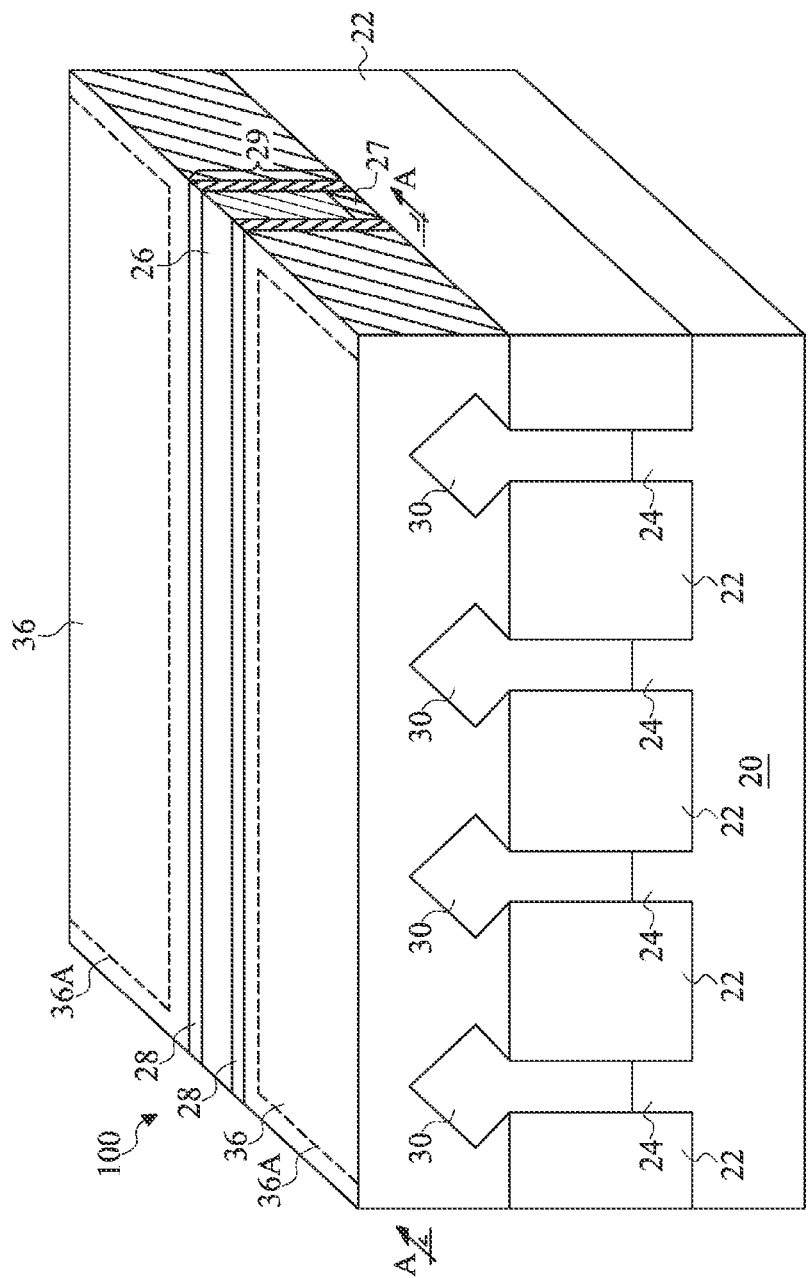

FIG. 6 illustrates a perspective view of the structure after Inter-Layer Dielectric (ILD) 36 is formed. In some embodiments, a buffer oxide layer (not shown) and a Contact Etch Stop Layer (CESL) are formed on source and drain regions 30 before the formation of ILD 36. In some embodiments, the buffer oxide layer comprises silicon oxide, and the CESL may comprise silicon nitride, silicon carbonitride, or the like. The buffer oxide layer and the CESL may be formed using Atomic Layer Deposition (ALD), for example. ILD 36 may comprise Flowable oxide formed using, for example Flowable Chemical Vapor Deposition (FCVD). ILD 36 may also include Phospho-Silicate glass (PSG), Boro-Silicate Glass (BSG), Boron-Doped Phospho-Silicate Glass (BPSG), Tetra Ethyl Ortho Silicate (TEOS) oxide, or the like. A Chemical Mechanical Polish (CMP) may be performed to level the top surfaces of ILD 36, gate stack 29, and gate spacers 28 with each other.

Figure 7:
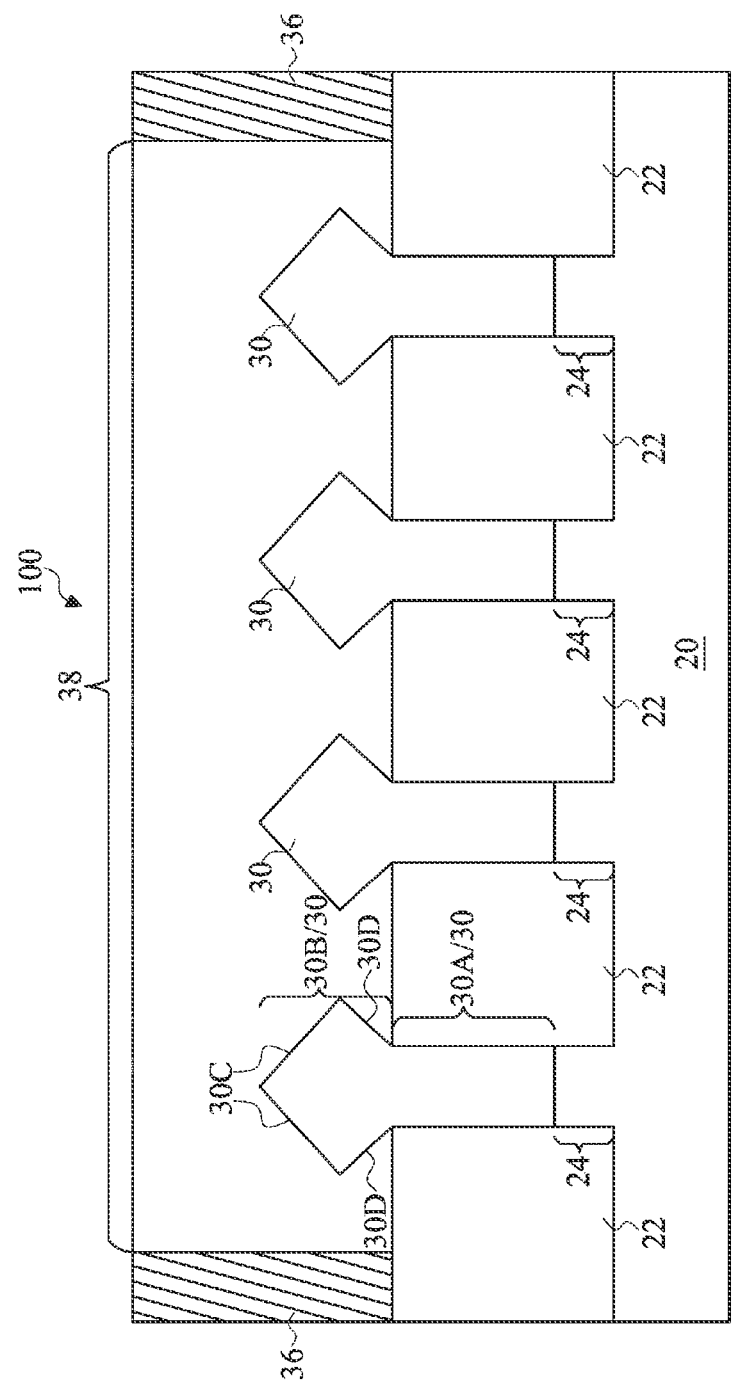

Next, dummy gate and dummy gate have to be replaced with HK and MG, then next the portions 36A of ILD 36 are removed to form contact openings. One of the contact openings 38 is shown in FIG. 7. FIGS. 7 through 10 are cross-sectional views obtained from the same vertical plane containing line A-A in FIG. 6.

As shown in FIG. 7, epitaxy regions 30 are exposed to contact openings 38. The buffer layer and the CESL, if any, will be removed from contact openings 38 in order to expose epitaxy regions 30. Contact opening 38 is located in ILD 36. Source/drain regions 30 may include a plurality of spade-shaped (diamond-shaped) epitaxy regions separated from each other in accordance with some embodiments. Epitaxy regions 30 have facets 30C and 30D. Facets 30C are upward facing facets and facets 30D are downward facing facets. Facets 30C and 30D may be on <111> planes of epitaxy regions 30.

Figure 8:
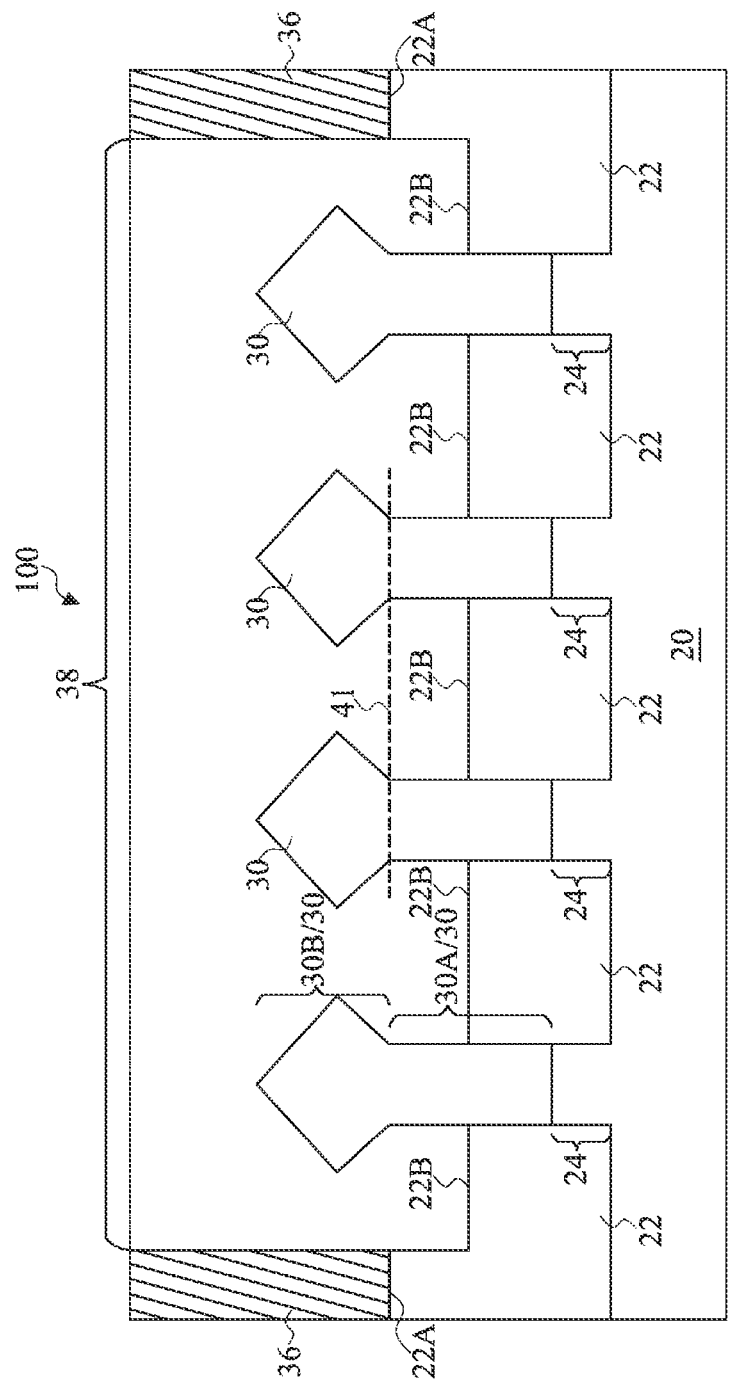

Next, referring to FIG. 8, STI regions 22 that are exposed through contact opening 38 are recessed using an etching step. The etching may be performed in a dry etching process. In some embodiments, the etching gases include HF and NH$_3$. In alternative embodiments, the etching gases include NF₃ and NH₃. During the etching process, plasma may be generated. Alternatively, in the etching process, plasma is generated. In an exemplary etching process, the etching gases have a pressure in the range between about 100 mtorr and about 200 mtorr. The flow rate of HF may be in the range between about 50 sccm and about 150 sccm. The flow rate of NH₃ may be in the range between about 50 sccm and about 150 sccm. Argon may also be included, with a flow rate in the range between about 20 sccm and about 100 sccm.

As shown in FIG. 8, after the STI recessing, the recessed top surfaces 22B of STI regions are below the level 41, at which portions 30B of source/drain regions 30 join the respective underlying portions 30A of source/drain regions 30. Accordingly, the sidewalls of epitaxy semiconductor portions 30A are exposed. As a result of the STI recessing, STI regions 22 include top surfaces 22A and top surfaces 22B that are lower than top surfaces 22A.

Figure 9:
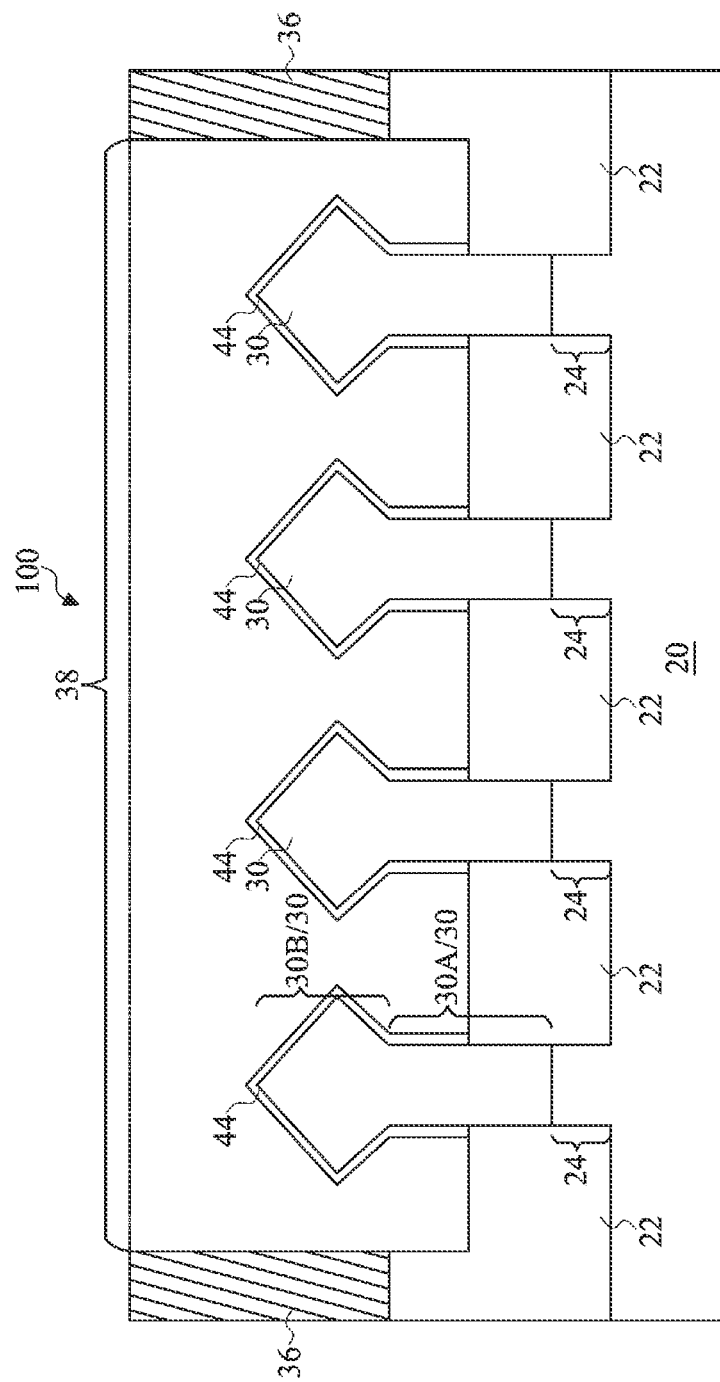

FIG. 9 illustrates the formation of source/drain silicide regions 44 on the exposed surfaces of source/drain regions 30. The formation of source/drain silicide regions 44 include forming a conformal metal layer (not shown) in opening 38, wherein the conformal layer is deposited on the exposed surfaces of portions 30A and 30B of source/drain regions 30. The metal layer might use a conformal deposition method such as Atomic Layer Deposition (ALD). The metal layer may include titanium, nickel, cobalt, or the like. An annealing is performed. In accordance with some embodiments, the annealing is performed using, for example, thermal soaking, spike annealing, flash annealing, laser annealing, or the like to form the metal silicide regions 44. Throughout the description, the terms "metal silicide" and "metal silicide/germanide" are used as generic terms to refer to metal silicides, metal germanides, and metal silicon germanides. The unreacted portions of the metal layer are then removed.

Source/drain silicide regions 44 are formed on the sidewalls of portion 30A, wherein the sidewalls of portions 30A are on opposite sides of portions 30A, and the opposite sidewalls of portions 30A are substantially parallel to each other, and are substantially vertical. Source/drain silicide regions 44 are further formed on the surfaces of portions 30B, which are laterally expanded beyond the edges of the respective underlying portion 30A.

Figure 10:
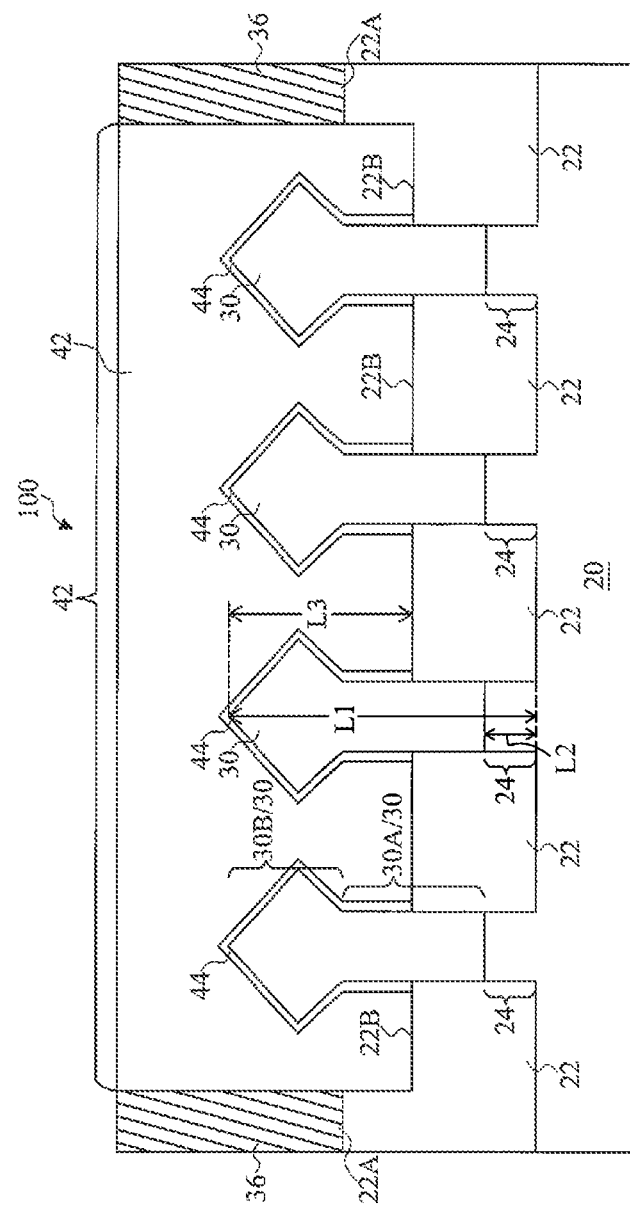

FIG. 10 illustrates the filling of opening 38 (FIG. 9) with a conductive material. After the filling of the conductive material, a Chemical Mechanical Polish (CMP) is performed to remove the excess portion of the conductive material, and the remaining conductive material in opening 38 forms contact plug 42. In some embodiments, contact plug 42 comprises tungsten. In alternative embodiments, contact plug 42 comprises other metal(s) or metal alloys such as aluminum, copper, titanium nitride, tantalum nitride, or the like. The filling of opening 38 may be performed using ALD, with the conductive material comprising tungsten, for example. The precursor may include WF₆, for example. Contact plug 42 extends from the top surface of ILD 36 to contact top surfaces 22B of STI regions 22.

It is appreciated that although source/drain portions 30B as in FIG. 10 have the shape of diamonds, they may also have other cross-sectional shapes due to the formation process and the subsequent annealing processes. For example, the corners of source/drain portions 30B may be much more rounded than illustrated.

Figure 11A:
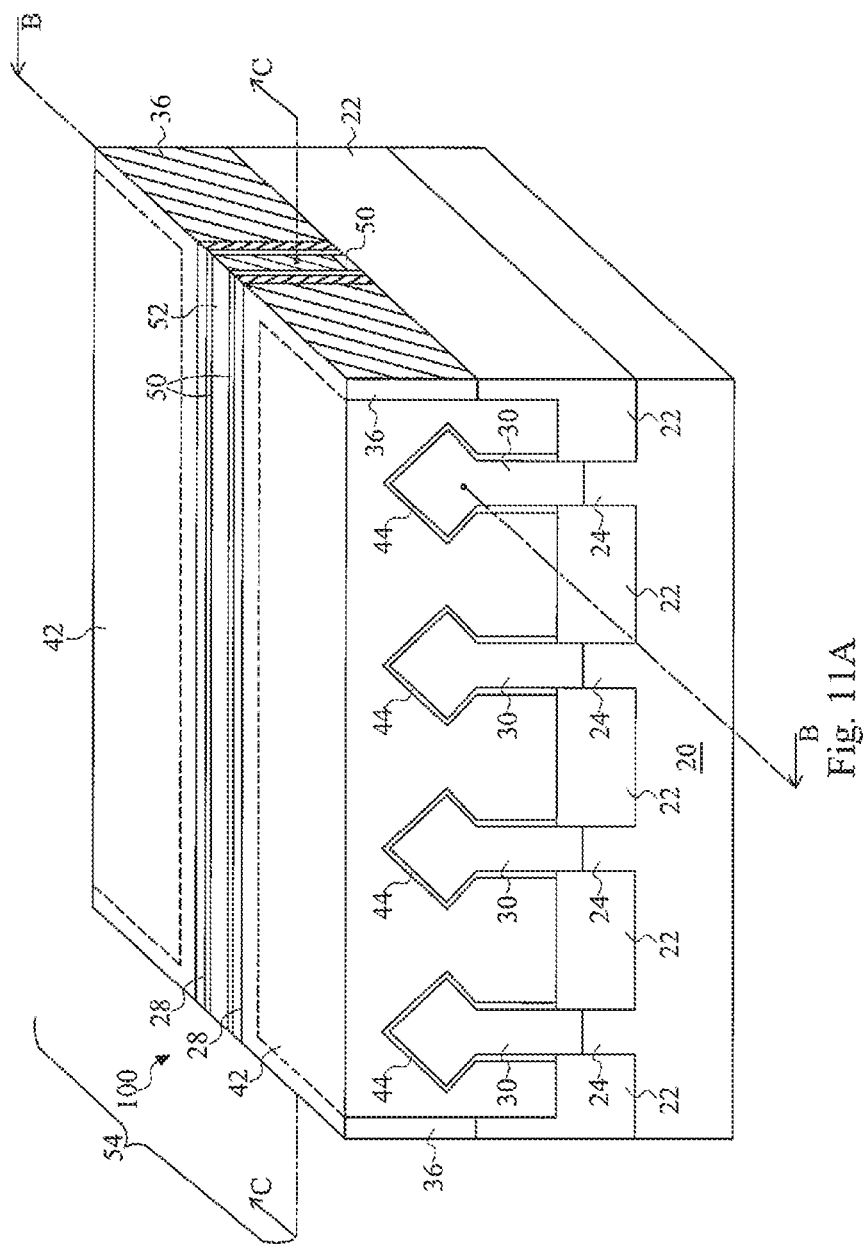

FIG. 11A illustrates a perspective view in the formation of replacement gate. First, dummy gate dielectric 27 and dummy gate electrode as shown in FIG. 6 are removed. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectric 50 and gate electrode 52. Gate dielectric 50 may comprise a high-k dielectric material with a k value greater than about 7.0, for example, and gate electrode 52 may comprise a metal or a metal alloy. Gate dielectric 50, gate electrode 52, and source and drain regions 30 in combination form FinFET 54.

Figure 11B:
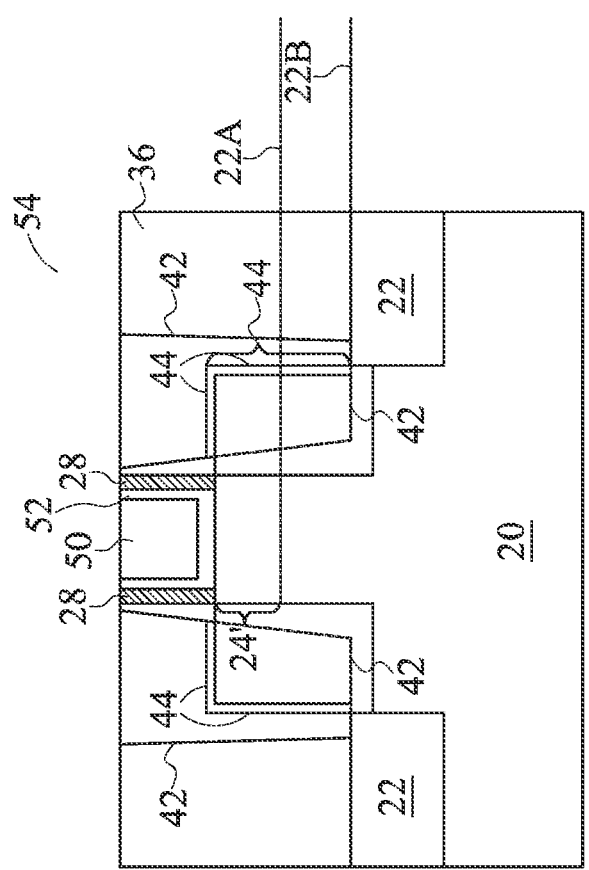

FIG. 11B illustrates the cross-sectional view of FinFET 54, wherein the cross-sectional view is obtained from the plane crossing line B-B in FIG. 11A. The top surface 22A (also refer to FIG. 4A) and 22B (also refer to FIGS. 4A and 8) of STI regions 22 are illustrated. The positions of fins 24' and silicide regions 44 are also illustrated. As clearly shown in FIG. 11B, silicide regions 44 and contact plug 42 extend below the bottom of semiconductor fin 24'.

Figure 11C:
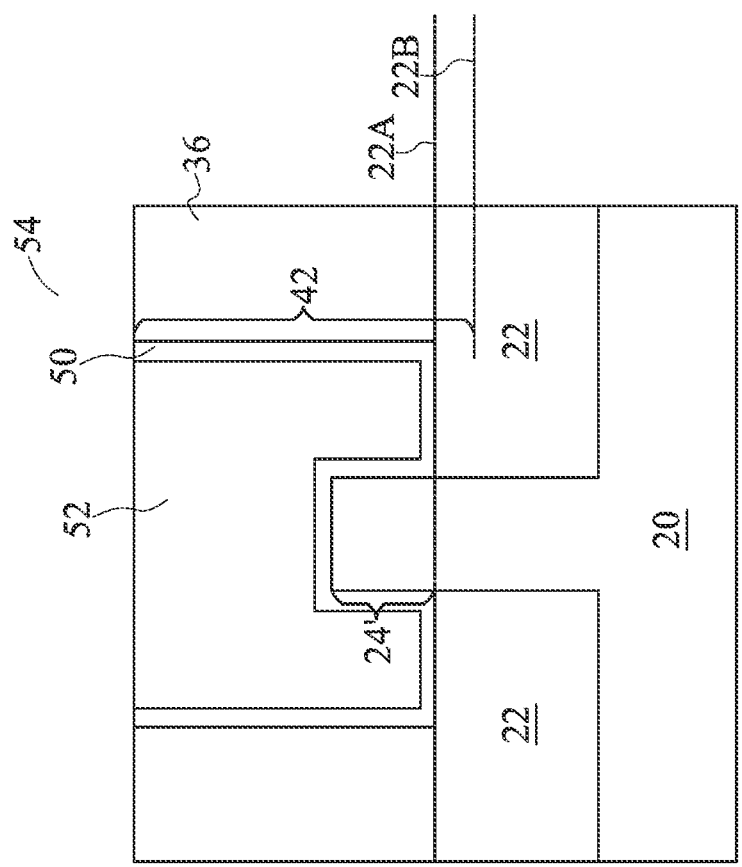

FIG. 11C illustrate the cross-sectional view of FinFET 54, wherein the cross-sectional view is obtained from the plane crossing line C-C in FIG. 11A. For simplicity, one fin 24' is formed, although there is a plurality of fins 24' in the cross-sectional view. As shown in FIG. 11C, semiconductor fin 24' is above the top surface 22A of STI regions 22. Gate dielectric 50 and gate electrode 52 are formed on the top surface and sidewalls of semiconductor fin 24'. The recessed top surface 22B of STI regions 22 is thus lower than the bottom of semiconductor fin 24'.

Referring back to FIG. 10 again, the vertical distance from the top end of epitaxy regions 30 to the bottom ends of STI regions 22 is defined as being length L1. The vertical distance from the bottom surface of epitaxy regions 30 to the bottom surfaces of STI regions 22 are defined as length L2. The vertical distance from the top end of source/drain regions 30 to the top surfaces 22A of STI regions 22 is defined as being length L3. In some exemplary embodiments, length L1 may be in the range between about 80 nm and about 200 nm. Length L3 may be in the range between about 20 nm and about 100 nm. It is appreciated, however, that the values recited throughout the description are merely examples, and may be changed to different values. In accordance with some embodiments, there is the relationship L1>L3>L2. Also, the ratio L3/L1 may be in the range between about 20 percent and about 100 percent. It is observed that by increasing the length L3, the sidewalls of portions 30A of source/drain regions 30 are exposed to form silicide regions 44, and hence the contact area is increased. The source/drain contact resistance is thus reduced due to the increased contact area.

Figure 12:
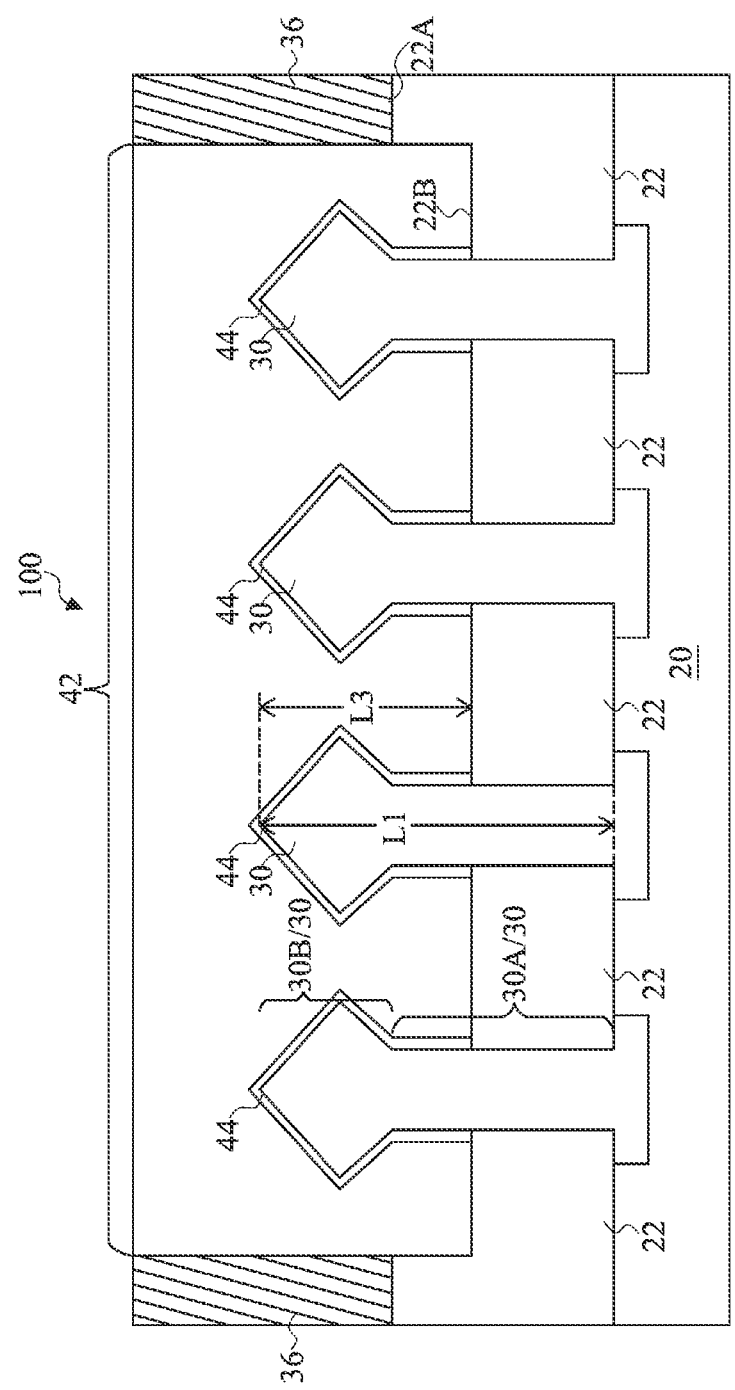
FIGS. 12 and 13 are cross-sectional views of FinFETs in accordance with alternative embodiments.

FIG. 12 illustrates the cross-sectional views of epitaxy regions 30, STI regions 22, silicide regions 44, and contact plug 42 in accordance with alternative embodiments. These embodiments are similar to the embodiments in FIGS. 11A, 11B, and 11C, except that epitaxy regions 30 extend to a level below the bottom surfaces of STI regions 22. The Formation process includes the step shown in FIG. 4B, wherein during the recessing of semiconductor strips 24, recesses 31 extend below the bottom surfaces of STI regions 22. The rest of the processes are essentially the same as what are shown in FIGS. 1 through 11C. In these embodiments, ratio L3/L1 may be in the range between about 20 percent and about 100 percent. In some exemplary embodiments, length L1 may be in the range between about 80 nm and about 200 nm. Length L3 may be in the range between about 20 nm and about 100 nm.

Figure 13:
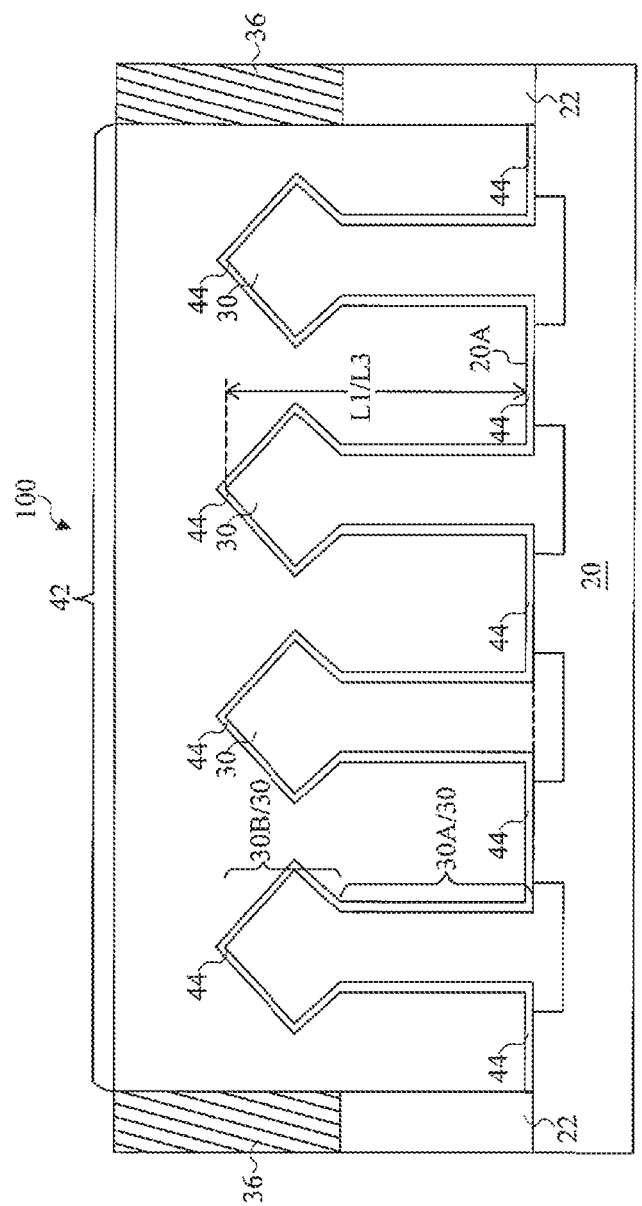

FIG. 13 illustrates the cross-sectional views of epitaxy regions 30, STI regions 22, silicide regions 44, and contact plug 42 in accordance with yet alternative embodiments. These embodiments are similar to the embodiments in FIG.

12, except that after the step as shown in FIG. 7, the portions of STI regions 22 that are exposed to opening 38 will be fully etched. Hence, no STI region exists between neighboring source/drain regions 30. Silicide regions 44 will be formed on the top surfaces 20A of substrate 20. In these embodiments, length L1 is equal to length L3.

The embodiments of the present disclosure have some advantageous features. By recessing STI regions after the epitaxy step for forming the epitaxy source/drain regions, the sidewalls of lower portions of the source/drain regions are exposed. As a result, the source/drain contact area is increased, and the source/drain contact resistance is reduced.

In accordance with some embodiments of the present disclosure, an integrated circuit structure includes a semiconductor substrate, insulation regions extending into the semiconductor substrate, with the insulation regions including first top surfaces and second top surfaces lower than the first top surfaces, a semiconductor fin over the first top surfaces of the insulation regions, a gate stack on a top surface and sidewalls of the semiconductor fin, and a source/drain region on a side of the gate stack. The source/drain region includes a first portion having opposite sidewalls that are substantially parallel to each other, with the first portion being lower than the first top surfaces and higher than the second top surfaces of the insulation regions, and a second portion over the first portion, with the second portion being wider than the first portion.

In accordance with alternative embodiments of the present disclosure, an integrated circuit structure includes a semiconductor substrate, insulation regions extending into the semiconductor substrate, with the insulation regions having a first top surface, and a first semiconductor fin and a second semiconductor fin parallel to each other and spaced apart from each other by a first portion of the insulation regions. The first portion of the insulation regions has a first top surface. The integrated circuit structure further includes a first source/drain region and a second source/drain region connected to the first semiconductor fin and the second semiconductor fin, respectively. A second portion of the insulation regions is between the first source/drain region and the second source/drain region. The second portion of the insulation regions has a second top surface lower than the first top surface.

In accordance with yet alternative embodiments of the present disclosure, a method includes forming a semiconductor fin, wherein the semiconductor fin is over top surfaces of insulation regions, with the insulation regions being on opposite sides of the semiconductor fin, forming a gate stack on a top surface and sidewalls of a middle portion of the semiconductor fin, etching an end portion of the semiconductor fin to form a recess, wherein the recess extends between opposite portions of the insulation regions, and performing an epitaxy to grow an epitaxy semiconductor region. The epitaxy semiconductor region includes a first portion in the recess, and a second portion over the top surfaces of the insulation regions. After the epitaxy, the insulation regions are etched. After the etching the insulation regions, a contact plug is formed to electrically couple to the epitaxy semiconductor region.

One general aspect of embodiments disclosed herein includes an device including: a substrate formed of a first semiconductor material; a semiconductor fin extending from the substrate; insulation regions on respective sides of the semiconductor fin, respective insulation regions each including a first top surface and second top surface lower than the first top surface; a gate stack extending over the semiconductor fin and extending further along a sidewall of the semiconductor fin; doped regions adjacent respective sides of the gate stack, each doped region including: a first portion having opposite sidewalls that are substantially parallel to each other, where the first portion is lower than the first top surface of an adjacent insulating region and higher than the second top surface of the adjacent insulation region, where the first portion has substantially vertical sidewalls; and a second portion over the first portion, where the second portion extends outward and widens from the respective sidewalls of the first portion, where both the first portion and the second portion are formed of a second semiconductor material different from the first semiconductor material; and a source/drain silicide region including a horizontal portion having a bottom surface level with bottom surfaces of respective insulation regions, and a third portion directly underlying the horizontal portion.

Another general aspect of embodiments disclosed herein includes a device including: a substrate including a first silicon material; insulation regions including a first portion and a second portion; a semiconductor fin including a first edge and a second edge contacting an edge of the first portion and an edge of the second portion, respectively, of the insulation regions; a source/drain region including: a lower portion overlapping the semiconductor fin, where the lower portion includes a third edge and a fourth edge aligned to the first edge and the second edge, respectively; and an upper portion overlapping the lower portion, where the upper portion includes upward facing facets and downward facing facets, where both the lower portion and the upper portion includes a second semiconductor material different than the semiconductor material of the semiconductor fin; and a source/drain silicide region, where the source/drain silicide region includes a horizontal portion having a bottom surface level with a bottom surface of the insulation regions, and the source/drain region further includes a portion directly underlying the horizontal portion of the source/drain silicide region.

Yet another general aspect of embodiments disclosed herein includes a device including: a semiconductor substrate; a first semiconductor fin extending form the substrate, the first semiconductor fin having a first sidewall and a second sidewall opposite the first sidewall; a first source/drain region formed in the first semiconductor fin, the first source/drain region having: a first lower portion with a first sidewall that is substantially aligned with the first sidewall of the first semiconductor fin, the lower portion having a second sidewall that is substantially aligned with the second sidewall of the first semiconductor fin, and a first upper portion having a first faceted sidewall that extends outwardly from and beyond the first sidewall of the first semiconductor fin and a second faceted sidewall that extends outwardly from and beyond the second sidewall of the first semiconductor fin; a second semiconductor fin extending form the substrate, the second semiconductor fin having a third sidewall and a fourth sidewall opposite the third sidewall; a second source/drain region formed in the second semiconductor fin, the second source/drain region having: a second lower portion with a third sidewall that is substantially aligned with the third sidewall of the second semiconductor fin, the second lower portion having a fourth sidewall that is substantially aligned with the fourth sidewall of the second semiconductor fin, and a second upper portion having a third faceted sidewall that extends outwardly from and beyond the third sidewall of the second semiconductor fin and a fourth faceted sidewall that extends outwardly from and beyond the fourth sidewall of the second semiconductor fin; and a silicide region that extends from and electrically connects the first faceted sidewall and the third faceted sidewall.

One other general aspect of embodiments disclosed herein includes a device including a semiconductor substrate formed of a first semiconductor material. The device also includes a plurality of semiconductor fins extending from the semiconductor substrate. The device also includes an insulating layer surrounding the semiconductor fins, the insulating layer having a topmost surface a first height above the semiconductor substrate and an intermediate surface a second lesser height above the semiconductor substrate. The device also includes a gate stack extending over the plurality of semiconductor fins, the gate stack extending down respective sidewalls of respective ones of the plurality of semiconductor fins and having a bottom surface in contact with the topmost surface of the insulating layer. The device also includes each semiconductor fin of the plurality of semiconductor fins including a source/drain region on a side of the gate stack, where the source/drain region includes: a first portion having a substantially columnar shape, when viewed in cross section, the first portion extending to a height above the intermediate surface of the insulating layer, and a second portion having a substantially faceted shape, when viewed in cross section, the second portion extending to a height from the topmost surface of the insulating layer to above the topmost surface of the insulating. The device also includes and a source/drain contact electrically connecting respective source/drain regions of respective semiconductor fins of the plurality of semiconductor fins, the source/drain contact extending below the topmost surface of the insulating layer and contacting the intermediate surface of the insulating layer.

Still another general aspect of embodiments disclosed herein includes a device having a semiconductor substrate formed of a first semiconductor material and having a semiconductor fin extending from a major surface thereof. The device also includes an insulation region extending into the semiconductor substrate and at least partially surrounding the semiconductor fin. The device also includes a gate stack extending over a top and sidewalls of the semiconductor fin. The device also includes a source/drain region adjacent a side of the gate stack, the source/drain region including a first portion. The device also includes and a second portion that extends from the first portion and extends above a topmost surface of the insulating region, the second portion having faceted sidewalls that extend out laterally from the first portion, where the first portion and the second portion include a semiconductor material that is different than the semiconductor fin material.

Still another general aspect of embodiments disclosed herein includes a method including steps of forming an insulator layer surrounding a semiconductor fin. The method also includes forming a gate stack over the semiconductor fin, the gate stack extending to a topmost surface of the insulator layer. The method also includes etching a portion of the semiconductor fin to leave a recess in the insulator layer, where a semiconductor material is exposed at a bottom of the recess. The method also includes epitaxially growing a source/drain region to fill the recess and to extend above the recess with faceted surfaces. The method also includes depositing a second insulator layer above the source/drain region and above the insulator layer. The method also includes forming a contact opening through the second insulator layer and partially through the insulator layer, the contact opening exposing the source/drain region, the contact opening further having a bottom defined by an intermediate surface of the insulator layer, the intermediate surface being below the topmost surface of the insulator layer. The method also includes and forming a contact in the contact opening, the contact having a bottommost surface that contacts the intermediate surface of the insulator layer.

One general aspect of embodiments disclosed herein includes a semiconductor device having a gate structure on a substrate. The semiconductor device also includes a source/drain on each of opposite sides of the gate structure and on the substrate. The semiconductor device also includes a source/drain contact on each of the source/drains, where each of the source/drain. The semiconductor device also includes contacts wraps around the sides of one source/drain. The semiconductor device also includes an interlayer dielectric (ILD) layer on opposite sides of each of the source/drain contacts. A portion of each source/drain contact has an outer shape that matches the outer shape on both sides of the underlying source/drain.

Other embodiments of a semiconductor device include a gate structure on a substrate, where the gate structure includes a gate sidewall, and a spacer. The semiconductor device also includes a source/drain on opposite sides of the gate structure and on the substrate, and a source/drain contact on opposite sides of each of the source/drains. The source/drain contacts wraps around the sides of source/drain and is in contact with the substrate. An interlayer dielectric (ILD) layer is on opposite sides of each of the source/drain. The semiconductor device also includes a source/drain contact having an inner shape that matches the outer shape on both sides of the underlying source/drain, and at least one channel layer between the source/drains, where each of the source/drains is.

Other embodiments of a semiconductor device include a plurality of semiconductor fins and fin extension formed on respective source and drain regions of the plurality of semiconductor fins. The semiconductor device also includes conductive contacts formed in contact with a top surface, an underside, and sidewalls of the respective fin extensions. The semiconductor device also includes and a conductive liner directly between the fin extensions and the conductive contacts, that covers extends between the plurality of semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a gate structure on a substrate;
a source/drain on each of opposite sides of the gate structure and on the substrate, each source/drain including a faceted region and a columnar region below the faceted region;
a source/drain contact on each of the source/drains, wherein each of the source/drain contacts wraps around the sides of one source/drain;
an interlayer dielectric (ILD) layer on opposite sides of each of the source/drain contacts; and wherein a portion of each source/drain contact has an outer shape that matches the outer shape on both sides of the underlying source/drain, and a portion of each source/drain contact extends along a sidewall of the columnar region.

2. The semiconductor device of claim 1, wherein the source/drain contacts are formed of a material comprising titanium, tungsten, aluminum, copper, or tantalum.

3. The semiconductor device of claim 1, wherein the source/drain contacts are in contact with respective portions of the substrate on opposite sides of the respective source/drains.

4. The semiconductor device of claim 1, wherein the gate structure further includes a gate sidewall spacer.

5. The semiconductor device of claim 4, wherein a portion of the ILD layer extends between the source/drain contact and the sidewall spacer.

6. The semiconductor device of claim 1, further comprising at least one channel layer between the source/drains, wherein each of the source/drains is in physical and electrical contact with the at least one channel layer.

7. The semiconductor device of claim 1, wherein respective outer surfaces of each source/drain contact are in physical contact with the ILD.

8. A semiconductor device; comprising:
a gate structure on a fin, wherein the gate structure includes a gate sidewall spacer;
wherein the fin includes respective source/drain regions on opposite sides of the gate structure;
respective source/drain extensions extending above the fin in the respective source/drain regions, each source/drain extension including a faceted upper region and a columnar lower region;
a source/drain contact, wherein the source/drain contact wraps around the sides of a respective source/drain extension and extends along sidewalls of the respective faceted upper region and the columnar lower region of the respective source/drain extension;
an interlayer dielectric (ILD) layer on opposite sides of each of the source/drain contacts;
at least one channel layer between the source/drains, wherein each of the source/drains is in physical and electrical contact with the at least one channel layer.

9. The semiconductor device of claim 8, wherein the source/drain contacts are formed of a material comprising titanium, tungsten, aluminum, copper, or tantalum.

10. The semiconductor device of claim 8, wherein the source/drains respectively have a diamond shaped profile.

11. The semiconductor device of claim 8, further comprising a liner between the source/drains and the source/drain contacts.

12. The semiconductor device of claim 8, further comprising a dielectric material contacting outer surfaces of the source/drain contacts.

13. The semiconductor device of claim 8, wherein the respective source/drains having upper facets extending away from a center point and lower facets extending toward a center point, when proceeding from top to bottom.

14. The semiconductor device of claim 13, wherein the respective source/drain contacts contact the upper facets and the lower facets.

15. The semiconductor device of claim 8, wherein the source/drain contact includes a silicide liner extending along sidewalls of the source/drains.

16. A semiconductor device, comprising:
a plurality of semiconductor fins;
an isolation layer, the isolation layer having a portion with a top surface that extends between the lowest portions of the respective semiconductor fins;
fin extensions formed on respective source and drain regions of the plurality of semiconductor fins that extend vertically and laterally beyond boundaries of the plurality of semiconductor fins, wherein respective fin extensions further extend lower than the top surface of the portion of the isolation layer;
conductive contacts formed in contact with a top surface, an underside, and sidewalls of the respective fin extensions; and
a conductive liner directly between the fin extensions and the conductive contacts.

17. The semiconductor device of claim 16, wherein the conductive liner is a silicide layer.

18. The semiconductor device of claim 16, wherein the conductive liner contacts the portion of the isolation layer.

19. The semiconductor device of claim 16, wherein the respective fin extensions include an upper faceted portion and a lower columnar portion.

20. The semiconductor device of claim 19, wherein respective conductive contacts extend along sidewalls of respective lower columnar portions.

* * * * *

UNITED STATES PATENT AND TRADEMARK OFFICE
CERTIFICATE OF CORRECTION

PATENT NO. : 11,695,061 B2
APPLICATION NO. : 17/173090
DATED : July 4, 2023
INVENTOR(S) : Huang et al.

It is certified that error appears in the above-identified patent and that said Letters Patent is hereby corrected as shown below:

In the Claims

Column 11, Claim 8, Line 40, after "contacts;" insert -- and --.

Signed and Sealed this
Fourteenth Day of November, 2023

Katherine Kelly Vidal
*Director of the United States Patent and Trademark Office*